United States Patent
Jain et al.

(10) Patent No.: US 7,216,312 B2
(45) Date of Patent: May 8, 2007

(54) DETERMINING ONE OR MORE REACHABLE STATES IN A CIRCUIT USING DISTRIBUTED COMPUTING AND ONE OR MORE PARTITIONED DATA STRUCTURES

(75) Inventors: Jawahar Jain, Santa Clara, CA (US); Amit Narayan, Redwood City, CA (US); Yoshihisa Kojima, Kawasaki (JP); Takaya Ogawa, Urayasu (JP); Subramanian K. Iyer, Austin, TX (US); Debashis Sahoo, Stanford, CA (US)

(73) Assignee: Fujitsu Limited, Kawasaki (JP)

( * ) Notice: Subject to any disclaimer, the term of this patent is extended or adjusted under 35 U.S.C. 154(b) by 37 days.

(21) Appl. No.: 10/704,234

(22) Filed: Nov. 7, 2003

(65) Prior Publication Data

US 2004/0199887 A1 Oct. 7, 2004

Related U.S. Application Data

(60) Provisional application No. 60/426,207, filed on Nov. 13, 2002.

(51) Int. Cl.
*G06F 17/50* (2006.01)
(52) U.S. Cl. .................. 716/4; 716/5; 716/6
(58) Field of Classification Search .......... 716/4–6
See application file for complete search history.

(56) References Cited

U.S. PATENT DOCUMENTS

| | | | | |
|---|---|---|---|---|
| 5,477,474 A | * | 12/1995 | Southgate et al. | 703/15 |
| 6,026,222 A | * | 2/2000 | Gupta et al. | 716/5 |
| 6,086,626 A | * | 7/2000 | Jain et al. | 716/5 |
| 6,141,633 A | * | 10/2000 | Iwashita et al. | 703/15 |
| 6,212,669 B1 | * | 4/2001 | Jain | 716/7 |
| 6,408,262 B1 | * | 6/2002 | Leerberg et al. | 703/2 |
| 6,415,430 B1 | * | 7/2002 | Ashar et al. | 716/18 |
| 6,457,162 B1 | * | 9/2002 | Stanion | 716/7 |
| 6,473,884 B1 | * | 10/2002 | Ganai et al. | 716/3 |
| 6,539,345 B1 | * | 3/2003 | Jones et al. | 703/15 |
| 6,728,665 B1 | * | 4/2004 | Gupta et al. | 703/2 |
| 2005/0171747 A1 | * | 8/2005 | Franco et al. | 703/2 |

* cited by examiner

*Primary Examiner*—Thuan Do
*Assistant Examiner*—Naum B. Levin
(74) *Attorney, Agent, or Firm*—Baker Botts L.L.P.

(57) ABSTRACT

In one embodiment, a method for determining one or more reachable states in a circuit using distributed computing and one or more partitioned data structures includes, at a first one of multiple computing systems, receiving a first partition of a circuit. The first partition corresponds to a first binary decision diagram (BDD) having a first density. The method includes performing a first reachability analysis on the first partition using the first BDD until a fixed point in the first partition has been reached and, if, during the first reachability analysis, the size of the first BDD exceeds a threshold, discarding the first BDD. The method includes communicating with at least one second one of the multiple computing systems. The second one of the multiple computing systems has received a second partition of the circuit. The second one of the multiple computing systems has performed a second reachability analysis on the second BDD without discarding the second BDD.

19 Claims, 3 Drawing Sheets

US 7,216,312 B2

DETERMINING ONE OR MORE REACHABLE STATES IN A CIRCUIT USING DISTRIBUTED COMPUTING AND ONE OR MORE PARTITIONED DATA STRUCTURES

RELATED APPLICATION

This application claims the benefit, under 35 U.S.C. §119(e), of U.S. Provisional Patent Application No. 60/426,207, filed Nov. 13, 2002, which is incorporated herein by reference.

TECHNICAL FIELD OF THE INVENTION

This invention relates in general to the field of circuit verification and more particularly to determining one or more reachable states in a circuit using distributed computing and one or more partitioned data structures.

BACKGROUND OF THE INVENTION

The proliferation of integrated circuits (ICs) has placed increasing demands on the design of digital systems included in many devices, components, and architectures. The number of digital systems that include ICs continues to steadily increase and may be driven by a wide array of products and systems. Added functionalities may be implemented in ICs in order to execute additional tasks or to effectuate more sophisticated operations in their respective applications or environments. Additionally, system parameters of ICs may dictate that their operations be performed in an optimal time interval, which allows for even more operations to be accommodated in a given clock cycle. These rigorous demands associated with production and design generally result in the need for more advanced and complex verification processes and procedures.

Verification techniques are generally implemented in order to ensure that an IC or a digital element is capable of performing its intended functionality. In other cases, verification techniques may be used in order to ascertain whether a selected characteristic, behavior, or property is present in a given target circuit. Flaws or inaccuracies in an IC or a digital element may inhibit system functionality and/or cause significant operational problems in a corresponding architecture.

SUMMARY OF THE INVENTION

Particular embodiments of the present invention may reduce or eliminate disadvantages and problems traditionally associated with circuit verification.

In one embodiment of the present invention, a method for determining one or more reachable states in a circuit using distributed computing and one or more partitioned data structures includes, at a first one of multiple computing systems, receiving a first partition of a circuit. The first partition corresponds to a first binary decision diagram (BDD) having a first density. The method includes performing a first reachability analysis on the first partition using the first BDD until a fixed point in the first partition has been reached and, if, during the first reachability analysis, the size of the first BDD exceeds a threshold, discarding the first BDD. The method includes communicating with at least one second one of the multiple computing systems. The second one of the multiple computing systems has received a second partition of the circuit. The second one of the multiple computing systems has performed a second reachability analysis on the second BDD without discarding the second BDD.

Particular embodiments of the present invention may provide one or more technical advantages. Particular embodiments increase efficiency of partitioned ordered binary decision diagram (POBDD)-based verification of circuits. Particular embodiments reduce time requirements associated with POBDD-based verification of circuits. Particular embodiments reduce memory requirements associated with POBDD-based verification of circuits. Particular embodiments reduce memory costs associated with POBDD-based verification of circuits. Particular embodiments provide superlinear speedup in the event of one or more circuit errors. Particular embodiments reduce the occurrence of space blowup in POBDD-based verification of circuits.

Particular embodiments provide a systematic method for covering a state space. Particular embodiments increase time and space efficiency of semiformal verification. Particular embodiments provide improved distribution of state-space coverage, such that state-space coverage is less localized. In particular embodiments, a continuous spectrum of time, memory, and coverage tradeoff is possible. In particular embodiments, less useful partitions are ignored according to a scheduling technique. In particular embodiments, only relatively easy states are covered, but uniform distribution is at least attempted.

Certain embodiments may provide all, some, or none of these technical advantages. Certain embodiments may provide one or more other technical advantages, one or more of which may be readily apparent to those skilled in the art from the figures, descriptions, and claims herein.

BRIEF DESCRIPTION OF THE DRAWINGS

To provide a more complete understanding of the present invention and the features and advantages thereof, reference is made to the following description, taken in conjunction with the accompanying drawings, in which.

DETAILED DESCRIPTION OF EXAMPLE EMBODIMENTS

Figure 1:
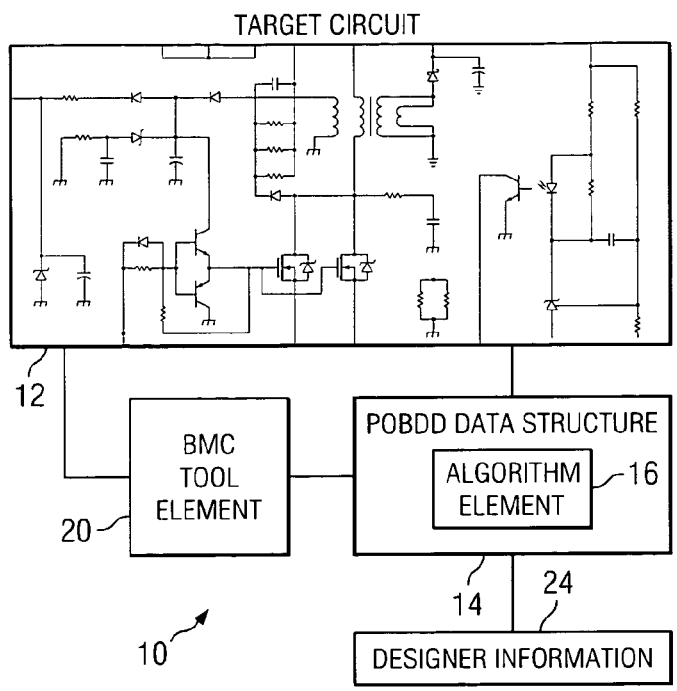
FIG. 1 illustrates an example system for determining one or more reachable states in a circuit using one or more partitioned data structures.

FIG. 1 illustrates an example system 10 for determining one or more reachable states in a circuit (such as target circuit 12) using one or more partitioned data structures. System 10 may include a partitioned ordered binary decision diagram (POBDD) data structure 14 that includes an algorithm element 16. Additionally, system 10 may include a bounded model checking (BMC) tool element 20 and a segment of designer information 24 that may be communicated to POBDD data structure 14. System 10 may generally be positioned within, or otherwise operate in conjunction with, any integrated circuit, digital element, processing configurations, or binary architecture in which verification procedures or processes may be implemented. Additionally, system 10 may be provided in cooperation with any device, component, hardware, software, object, or element associated with digital processing of information or data.

System 10 operates to provide a verification process capable of reaching significant depths in sub-spaces of target circuit 12. By using POBDD data structure 14 and an analysis that involves imaging and preimaging operations, selected states that are provenly deep may be identified. These states may then be represented in a BDD format and then mapped as a conjunctive normal form (CNF) formula. The CNF formula may then be provided to BMC tool element 20 as a set of starting states from which to begin an enhanced verification analysis. BMC tool element 20 may then execute bounded model checking operations using these starting states (instead of initiating its operations from a single state) in order to effectuate a verification procedure associated with target circuit 12. A single state generally represents an initial state that is predominantly shallow. By providing starting states that are already deep, BMC tool element 20 achieves enhanced verification results because it may reach deeper into target circuit 12. In addition, the initial deep states may be obtained using POBDD data structure 14 in an optimal time interval, which in turn results in a significant advance in efficacy for the verification procedure.

System 10 provides a verification architecture that is significantly faster than other verification or simulation techniques. This may be due, in part, to the integration of several verification approaches that may be combined in order to enhance a starting point associated with bounded model checking operations. In certain embodiments, such a verification approach may be particularly beneficial for elements that have a large sequential depth.

System 10 may also extend reachability parameters associated with target circuit 12. New or unexplored deep states within target circuit 12 may be uncovered using system 10. System 10 may allow verification to be executed deep into circuits. System 10 may achieve a significant reduction in latency associated with the verification process. Depth may be an exact depth or the approximate depth depending on what the user wants. The approximate depth is only an upper bound on the actual depth. To calculate the depth of the states, the following operation may be implemented. Assume the user is starting from set of states $s\_0$ and assume given windows $w$, $w'$ where $w'$ is a complement of $w$). Referring to $s\_0$ as a BASE-set, the following operations may be executed:

1. image on BASE-set (under window $w$) and get $s\_1$;
2. pre-image on $s\_1$ in window $w'$ and get pre-$s\_1(w')$;
3. image on pre-$s\_1(w')$ (under window $w$) and get $s\_1'$;
4. calculate $s\_1''=s\_1-s\_1's\_1''$ reflecting the set of states in window $w$ that cannot be reached from outside the window. $s\_1''$ becomes now our starting point (BASE-set) to calculate states of even greater depth.

In general, steps 1–4 can be suitably repeated, giving states with greater and greater depth. This takes into consideration states that are of a given depth as calculated from within the window $w$. It can be suitably modified, where appropriate, to include states whose depth is some minimum "d" where the path of length "d" criss-crosses from one window to another. This can be achieved by keeping a set whose depth is updated during each step of image/pre-image. There can be numerous ways of keeping a running count of depth of some states. A simple way to do this calculation can be seen if the reachability is done in a breadth-first manner. To each partition $w\_1, \ldots, w\_k$ the above procedure may be applied and then a calculation may be executed reflecting the actual depth of a state even if it is obtained by a criss-cross path starting form initial state.

Target circuit 12 is an electronic or digital object sought to be tested in order to verify that it operates according to its prescribed or intended functionality. The integrity, validity, or design specifications of a sub-space within target circuit 12 may be analyzed using POBDD data structure 14. Target circuit 12 may include any associated circuitry, inclusive of logic gates, counters, inverters, buffers, or any other suitable devices, components, or objects capable of cooperating or interacting with target circuit 12. Target circuit 12 may alternatively be any other suitable device, component, architecture, arrangement, hardware, software, object or element capable of processing binary data or digital information in a verification environment. Target circuit 12 may be designed specifically to include (or be capable of performing) some property. The term "property" as used herein in this document is inclusive of any capability, characteristic, operation, action, or behavior that may be associated with target circuit 12. In operation, target circuit 12 may be verified or otherwise validated in order to ensure that it maintains its designated property or characteristic, or that it performs a prescribed operation properly.

POBDD data structure 14 is an element operable to execute partitioning of BDD elements in a binary or digital environment. POBDD data structure 14 is a representation of a Boolean function for manipulation. As referred to herein, POBDD data structure 14 may be inclusive of a partitioned reduced order binary decision diagram (PROBDD) or BDD data structures (potentially with partitioning) where appropriate. The terms PROBDD and POBDD are interchangeable and generally represented in various suitable fashions (for purposes of brevity in certain cases) in describing their applications, where appropriate. POBDD data structure 14 may receive designer information 24 and perform a preliminarily analysis on target circuit 12 in order to retrieve a first set of states based on designer information 24. The first set of states from a sampled sub-space may then be used in order to augment or otherwise enhance the capabilities of BMC tool element 20. POBDD data structure 14 may invoke one or more algorithms included in algorithm element 16 in order to evaluate a selected property associated with target circuit 12. The first set of states allows BMC tool element 20 to extend deep into target circuit 12.

POBDDs are generally canonical and, therefore, may be used for combinational equivalence checking. POBDDs may be successively applied in reachable analyses for sequential circuit verification. Reachable state sets may be represented as POBDDs. This minimizes the memory requirement by only keeping one partition in a corresponding memory during a given time interval. Additionally, fixed point computations may be performed on each partition separately using reachability algorithms, which may be included within algorithm element 16, in conjunction with POBDD protocols that are effectuated by POBDD data structure 14.

POBDD data structure 14 is generally faster than other approaches used in verification operations. Moreover, the partitioned structure of POBDD data structure 14 is compact and may provide for much easier parallelization. Additionally, POBDD data structure 14 may offer dynamic partitioning that avoids memory deterioration, which may also be referred to in certain applications as "memory blowup." POBDD data structure 14 may cover a large volume of states within target circuit 12 quickly and, further, break designs into loosely coupled sets of interacting finite state machines.

In operation of an example embodiment, a designer or a manufacturer may write some program that identifies a property, characteristic, operation, or behavior that is sought to be tested or verified in target circuit 12. The property or characteristic may be suitably written in a particular syntax before it is communicated to POBDD data structure 14. The program may then be properly communicated to POBDD data structure 14, whereby POBDD data structure 14 tests the specified property in target circuit 12. POBDD data structure 14 may then generate a first set of states, represent the first set in a BDD format, and map the BDD format into a CNF formula to be forwarded to BMC tool element 20.

CNF is a conjunction of clauses, where clauses are either attribute-value conditions or disjunctions of attribute-value conditions. A Boolean expression having junctors in {AND, OR} is in conjunctive normal form if no junctors are negated and if no AND junctor is dominated by an OR junctor. For example, (color=red or color=green) and (shape=rectangular) is a formula in CNF. A Boolean formula in this form is expressed as an AND of clauses, each of which is the OR of one or more literals. The theory of CNFs may also be thought of as a conjunction of disjunctions. Each disjunction can be represented as a clause that includes positive literals and negative literals. The variables may be quantified universally. For logic programming (Prolog, Fril, etc.) it is beneficial to be able to transform sentences into statements a computer can accommodate. Logic programming statements may take the form of horn clauses that are conditional sentences with a particularly simple structure. It can be shown that every propositional logic sentence is equivalent to a sentence in conjunctive normal form.

In particular embodiments, by invoking or implementing a selected algorithm within algorithm element 14, POBDD data structure 14 may selectively explore deep into target circuit 12 without looking at an entire circuit architecture or configuration. Viewing an entire circuit element may slow the verification process significantly. Instead, algorithm element 16 may be invoked such that predetermined locations within target circuit 12 are visited in order to evaluate a small fragment of states (within sub-spaces) in a deep manner.

Algorithm element 16 is a data processing object that may include one or more algorithms that allow for a specific or designated property to be explored or verified in target circuit 12. Algorithm element 16 may be included within POBDD data structure 14 or provided external thereto in accordance with particular processing needs or arrangements. Additionally, algorithm element 16 may communicate with any other external component that provides one or more instructions or characteristics to be used in verifying sub-spaces within target circuit 12. Moreover, algorithm element 16 may directly receive designer information 24 in order to verify one or more properties associated with target circuit 12. Designer information 24 may also include or specify the type of circuit or element being subjected to the verification process. Algorithm element 16 may include any suitable hardware, software, objects, or elements operable to facilitate the verification operations being executed by POBDD data structure 14.

For purposes of example and teaching it is useful to provide a further explanation of some of the algorithms that may be used in verifying selected properties associated with sub-spaces of target circuit 12. Many operations for the manipulation of Boolean functions can be performed efficiently for functions represented by OBDDs. For example, some of the basic operations are provided by:

1. Evaluation. For an OBDD G representing f and an input a compute the value f(a).
2. Reduction. For an OBDD G compute the equivalent reduced OBDD.
3. Equivalence test. Test whether two functions represented by OBDDs are equal.
4. Satisfiability problems. Problems may include:
   Satisfiability. For an OBDD G representing f find an input a for which f(a)=1 or output that no such input exists.
   SAT-Count. For an OBDD G representing f, compute the number of inputs a for which f(a)=1.
5. Synthesis (also referred to as apply). For functions f and g represented by an OBDD G include into G a representation for f$\otimes$g where $\otimes$ is a binary Boolean operation (e.g.,$\wedge$).
6. Replacements (also called Substitution).
   Replacement by constants. For a function f represented by an OBDD, for a variable $x_i$ and a constant $c \in \{0, 1\}$ compute an OBDD for $f_{|x_i=c}$.
   Replacement by functions. For functions f and g represented by an OBDD and for a variable $x_i$ compute an OBDD for $f_{|x_i=g}$.
7. Universal quantification and existential quantification. For a function f represented by an OBDD and for a variable $x_i$ compute an OBDD for $(\forall x_i:f):=f_{|x_i=0} \wedge f_{|x_i=1}$ or $(\exists x_i:f):=f_{|x_i=0} \vee f_{|x_i=1}$, respectively.

In OBDD packages the operation reduction is usually integrated into the other operations such that only reduced OBDDs are represented. Many applications of OBDDs concern functions given as circuits. Hence, one important operation is the computation of an OBDD for a function given by a circuit, which is usually performed by the symbolic simulation of the circuit. This means that OBDDs for the functions representing the input variables are constructed. This may be easy because an OBDD for the function $x_i$ merely consists of a node labeled by $x_i$ with the 0-sink as 0-successor and the 1-sink as 1-successor. The circuit may be evaluated in some topological order (each gate is considered after all its predecessors have been considered) and a computation is made for each gate. The computation is a representation of the function at its output by combining the OBDDs representing the functions at its input using the synthesis operation.

Another possibility is that a given circuit is built of larger blocks. In such a case, OBDDs may be computed for the functions computed by each block and combine the OBDDs with the operation replacement by functions. In the case of computed OBDDs, for the functions represented by two circuits, the equivalence operation for OBDDs may be applied in order to test the circuits for equivalence.

In applications such as Boolean matching, signatures for the considered functions may be computed. A signature is a property of a function that can be computed efficiently and that is likely to be different for different functions. Signatures can be used to detect that given functions are different. A very simple signature is the number of satisfying inputs of a function. The operation SAT-count may be applied in order to compute this and other signatures where appropriate.

BMC tool element 20 is a component operable to execute bounded model checking operations on target circuit 12. BMC tool element 20 may receive information from POBDD data structure 14 and use that information in order to execute verification techniques on target circuit 12. BMC tool element 20 may use semi-formal verification approaches and be further enhanced by using a first set of states provided by POBDD data structure 14. BMC tool element 20 may employ SAT techniques to execute proper bounded model checking. In bounded model checking, a Boolean formula is constructed that is satisfiable if the underlying state transition system can realize a finite sequence of state transitions that reaches certain states of interest. BMC tool element 20 may include any suitable device, component, hardware, software, object, or element operable to execute one or more bounded model checking processes or operations such that selected sub-spaces of target circuit 12 may be verified or validated.

BMC tool element 20 may also be appropriately modified such that it can utilize a first set of states instead of a single initial state. This may allow system 10 to reach provenly deep sub-spaces within target circuit 12. Accordingly, the capacity of the program within BMC tool element 20 is effectively enhanced in order to improve the verification process. After the BMC program is executed, it may be determined that neighboring segments have been exhaustively explored such that an adequate sampling of target circuit 12 has been effectuated. The decision of whether to continue sampling sub-spaces of target circuit 12 may rest with an end user or controlled by the BMC program characteristics.

For purposes of teaching and example, some of the principles and concepts associated with POBDD, PROBDD, and BDD operations are provided below. The proffered description is only being provided to assist in the understanding of some of the complex theorems associated with partitioned BDD technology. The description should not be construed to limit any of the operations of any of the elements of system 10. It is imperative to recognize that the following description is for purposes of example only and should not be interpreted to restrict any other suitable operations that may be executed by POBDD data structure 14 or any other element involved in partitioning operations or the verification process.

In order to describe partitioned ROBDDs, it is useful to consider the following example. Assume a Boolean function $f: B^n \to B$ defined over n inputs $X_n = \{x_1, \ldots, x_n\}$. The partitioned-ROBDD representation $X_f$ of f is defined as follows:

Given a Boolean function: $f: B^n \to B$ defined over $X_n$, a partitioned-ROBDD representation $X_f$ of f is a set of k function pairs, $\chi_f = \{(\omega_1, \bar{f}_1), \ldots, (\omega_k, \bar{f}_k)\}$ where, $\omega_i B^n \to B$ and $\bar{f}_i: B^n \to B$, for $1 \leq i \leq k$, are also defined over $X_n$ and satisfy the following conditions:

1. $w_i$ and $\bar{f}_i$ are represented as ROBDDs with the variable ordering $\pi_i$, for $1 \leq i \leq k$.
2. $w_1 + w_2 + \ldots + w_k = 1$
3. $\bar{f}_i = w_i \wedge f$, for $1 \leq i \leq k$ In the example provided, + and $\wedge$ represent Boolean OR and AND respectively. The set $\{w_1, \ldots, W_k\}$ is denoted by W.

Each $w_i$ may be referred to as a window function. Intuitively, a window function $w_i$ may represent a part of the Boolean space over which f is defined. Every pair $(w_j, \bar{f}_j)$ may represent a partition of the function f. In the example, the term "partition" is not being used in the sense where partitions have to be disjoint. If, in addition to conditions 1–3 (provided above), $w_i \wedge w_j = 0$ for $i \neq j$, then the partitions may be orthogonal. Each $(w_j, \bar{f}_i)$ may now be considered a partition in a conventional sense.

In constructing partitioned ROBDDs, the performance of partitioned ROBDDs generally depends on the ability to generate effective partitions of the Boolean space over which the function can be compactly represented. The issue of finding adequate partitions of the Boolean space is central to the partitioned-ROBDD representation. Described herein are example heuristics, which may be effective in generating compact, orthogonally partitioned-ROBDDs. Although a Boolean netlist is used in the present approach, the techniques described are general and may be applied or extended to any arbitrary sequence of Boolean operations.

In an example BDD partitioning approach, the number of windows may be decided either a priori or dynamically. After a window $w_i$ is decided, a partitioned-ROBDD corresponding to it may be obtained by composing F in the Boolean space corresponding to the window $w_i$. In partitioning, the BDD for some function F, a decomposed BDD representation (i.e., a BDD which is not in terms of input variables but in terms of some pseudo-input variables that are created in the process of building BDDs for the given target function F) is considered. To create the partitioned BDD for F, its corresponding decomposed BDD may be analyzed to yield the partitions. The partition decision may be typically taken because the decomposed BDD for F in terms of its decomposition points, $\Psi_1, \ldots, \Psi_k$ cannot be composed. Note, the partitioned BDD for F, from its decomposed BDD, may be created in following three ways:

(1) Partition using input variables. The number of input variables may be changed dynamically or can be set to a predetermined constant.

(2) Partition using "internal" variables, i.e., variables that are not input variables. Such variables can be pseudo-variables introduced at internal gates.

(3) Partition using a suitable combination of 1 and 2.

At any given point in time in the present filtering based verification process a decomposed representation may be reflected by, $f_d(\Psi, X)$, of F where $\Psi = \{\psi_1, \ldots, \psi_k\}$ is called a decomposition set and it corresponds to the internal cut set selected, typically, by the naive cut or the smart cut process, and each $\psi_i \in \Psi$. is a decomposition point. Let $\Psi_{bdd} = \{\psi_{1_{bdd}}, \ldots, \psi_{k_{bdd}}\}$ represent the array containing the ROBDDs of the decomposition points, i.e., each $\psi_i \in \Psi$. has a corresponding ROBDD, $\psi_{i_{bdd}} \in \Psi_{bdd}$, in terms of primary input variables as well as (possibly) other $.\psi_j \in \Psi.$, where $\psi_j \neq \psi_i$. Similarly, the array of $\psi_{i_{bdd}w_i}$ may be represented by $\Psi_{i_{bdd}w_i}$. The composition [?] of $.\psi_i$ in $f_d(\Psi, X)$ may be denoted by $f_d(\Psi, X) \cdot (\Psi_i \Leftarrow \psi_{i_{bdd}})$, where, $$f_d(\Psi, X) \cdot (\psi_i \leftarrow \psi_{i_{bdd}}) = \overline{\psi_{i_{bdd}}} \cdot f_{d\overline{\psi_i}} + \psi_{i_{bdd}} f_{d\psi_i}" \quad (1)$$

The vector composition of the $\Psi$ in $f_d(\Psi, X)$ may be denoted by $f_d(\psi, X) \cdot (\psi \leftarrow \psi_{bdd})$ and may represent a successive composition of $\psi_i$'s into $f_d$.

In considering partitioning of a decomposed representation, given a window function $w_i$, a decomposed representation $f_d(\Psi, X)$, and the ROBDD array $\Psi_{bdd}$ of f, $f_i$ is sought such that the ROBDD representing $f_i = w_i \wedge f_i$ is smaller than f. It can be shown that all $w_i$, which may be nothing but cubes, may satisfy this requirement.

Given $f_d$, $\Psi_{bdd}$, and $w_i$s, the cofactors $\psi_{w_i}$ and $f_{d_{w_i}}$ may be created. By composing $\psi_{bdd_{w_i}}$ in $F_{dwi}$, the partition function $f_i = f_{w_i} f_i = f_{w_i}$ may be achieved. Thus, given a set of window functions $w_i$, the partitioned-ROBDD $x_f$ of f may be given by $\chi_f = \{(w_i, w_i \wedge \int_{w_i}) | 1 \leq i \leq k\}$. It is generally easy to check that the above definition satisfies all the conditions of Definition 1.

If $w_i$ is a cube, $f_i$ has a smaller size than the ROBDD for f. Also, the ROBDD representing $w_i$ has k internal nodes where k is the number of literals in $w_i$. Because $w_i$ and $f_{wi}$ have disjoint support, $|\bar{f}_i| = |w_i \wedge f_i| = (k + |f_i|) \approx |f_i|$. Also, because each intermediate result of building $f_i$ will be smaller than that of building f, the intermediate peak memory requirement is also reduced. This may not be true in the presence of dynamic variable reordering when f and $f_i$ can have different variable orderings. In practice, because dynamic variable reordering operates on smaller graphs in the case of partitioning, it is even more effective.

When the window function is a more complex function of PIs than a cube, $f_i = f_{w_i}$ may be used. $f_{w_i}$ is the generalized cofactor of f on $w_i$. The generalized cofactor of f on $w_i$ is generally much smaller than f. But in the example case provided, the size of the $i^{th}$ partitioned-ROBDD $|f_i|$ can be $O(|w_i|\|f_i|)$ in the worst case. To avoid this, while using general window functions, wis may be used, which is generally small.

With regards to the selection of window functions, after deciding how to construct the partition function from a given window function, methods to obtain appropriate window functions may be evaluated. The methods may be divided into two categories: a priori selection and "explosion" based selection.

In a priori partitioning, a predetermined number of primary inputs (PIs) is selected to partition. If it is decided to partition on 'k' PIs, then $2^k$ partitions are created that correspond to all the binary assignments of these variables. For example, if it is decided to partition on $x_1$ and $x_2$, four partitions may be created: $x_1x_2, x_1\overline{x_2}, \overline{x_1}x_2$ and $\overline{x_1x_2}$. For a given window function of this type, partitioned-ROBDDs can be created, which are guaranteed to be smaller than the monolithic ROBDD. Because only one partition needs to be in the memory at a given time, success is highly likely in the selected space. The reduction in memory is large and may be accompanied by an overall reduction in the time taken to process all partitions as well.

Variables should be selected that maximize the partitioning achieved while minimizing the redundancy that may arise in creating different partitions independently. This reflects a fundamental principle of many divide and conquer approaches. The cost of partitioning a function f on variable x may be defined as:

$$cost_x(f) = \alpha[p_x(f)] + \beta[r_x(f)] \quad (2)$$

where $p_x(f)$ represents the partitioning factor and is given by, $$p_x(f) = \max\left(\frac{|f_x|}{|f|}, \frac{f_{\overline{x}}}{f}\right) \quad (3)$$

and $r_x(f)$ represents the redundancy factor and is given by, $$r_x(f) = \left(\frac{|f_x + f_{\overline{x}}|}{|f|}\right) \quad (4)$$

A lower partitioning factor may be beneficial as it implies that the worst of the two partitions is small and similarly a lower redundancy factor is beneficial because it implies that the total work involved in creating the two partitions is less. The variable x that has the lower overall cost is chosen for partitioning.

For a given vector of functions F and a variable x, the cost of partitioning may be defined as:

$$cost_x(F) = \sum_{i=1}^{k} cost_x(f_i)$$

The PIs may be numbered in increasing order of their cost of partitioning $f_d$ and $\Psi$ and the best 'k' (where 'k' is a predetermined number specified by the user) may also be selected. Using a similar cost function, PI variables may be selected as well as pseudo-variables, such as $a.\psi_{i_{bdd}}$ expressed in terms of PIs, to create partitioned-ROBDDs. In the example case, the cofactor operations may become generalized cofactor operations for window functions that are non-cubes. This type of selection, where all the PIs are ranked according to their cost of partitioning $f_d$ and $\Psi$, is called a static partition selection.

Alternatively, a dynamic partitioning strategy may be used in which the best PI (e.g. x) is selected based on $f_d$ and $\Psi$ and then the subsequent PIs are recursively selected based on $f_{d_x}$ and $\Psi_x$ in one partition and in $f_{d_{\overline{x}}}$ and $\Psi_{\overline{x}}$ in the other partition. The dynamic partitioning method may require an exponential number of cofactors and can be cost-prohibitive in certain circumstances. The cost can be somewhat reduced by exploiting the fact that the only values that are of interest are the sizes of the cofactors of $f_d$ and $\psi_{i_{bdd}}$s. An upper bound on the value of $|f_{d_x}|$ can be calculated by traversing the ROBDD of $f_d$ and taking the x=1 branch whenever the node with variable id corresponding to x is encountered. The method does not give the exact count as the BDD obtained by traversing the ROBDD in this manner is not reduced. One advantage of such an implementation is that no new nodes need to be created and the traversal is relatively quick.

Partitions may be created such that the number of partitions are chosen dynamically. In one case, each time the BDDs blow-up, partitioning is executed dynamically using splitting variables, chosen in the increment of 1, until the BDD blow-up is deemed to be circumvented.

In explosion based partitioning, the $\psi_{i_{bdd}}$ s in $f_d$ is successively composed. If the graph size increases significantly for some composition (e.g. $\Psi_j$), a window function may be selected (e.g. w) based on the current $f_d$ and $\psi_{j_{bdd}}$. The window functions may be either a PI and its complement or some $\psi_{k_{bdd}}$ and its complement that is expressed in terms of PIs only and that has a small size.

Once the window function w is obtained, two partitions $(w \wedge f_{d_w}, \psi_w)$, and $(\overline{w} \wedge f_{d_{\overline{w}}}, \psi_{\overline{w}})$ may be created and the routine on each of the partitions may be recursively recalled. In general, if the resulting BDD after composition is more than ten times larger then the sum of all the previous decomposed BDDs that have already been composed and the size of original decomposed BDD, explosion based partitioning may be executed.

In a priori variable selection, as well as explosion based partitioning, a fixed number of splitting variables is determined. Explosion based partitioning followed by a fixed number of primary input variables based partitioning (or a vice-versa process) may then be executed. The explosion based partitioning can use both the primary inputs as well as pseudo-variables/decomposition points.

After selecting a window function and creating the decomposed representation for the $i^{th}$ partition given by $f_{d_{w_i}}$ and $\psi_{w_i}$, the final step is to compose $\psi_{w_i}$ in $f_{d_{w_i}}$, i.e., $f_{d_{w_i}}(\psi, X)(\psi \leftarrow \psi_{bdd_{w_i}})$. Although, the final ROBDD size is constant for a given variable ordering, the intermediate memory requirement and the time for composition may be a strong function of the order in which the decomposition points are composed. For candidate variables that can be composed into $f_d$, a cost can be assigned that estimates the size of the resulting composed ROBDD. The variable with the lowest cost estimate may be composed. A decomposition variable may be chosen that leads to the smallest increase in the size of the support set of the ROBDD after composition. At each step, candidate $\psi_s$ may be restricted for composition to those decomposition points that are not present in any of the other $\psi_{bdd}$S. This may ensure that a decomposition variable needs to be composed only once in $f_d$.

Figure 2:
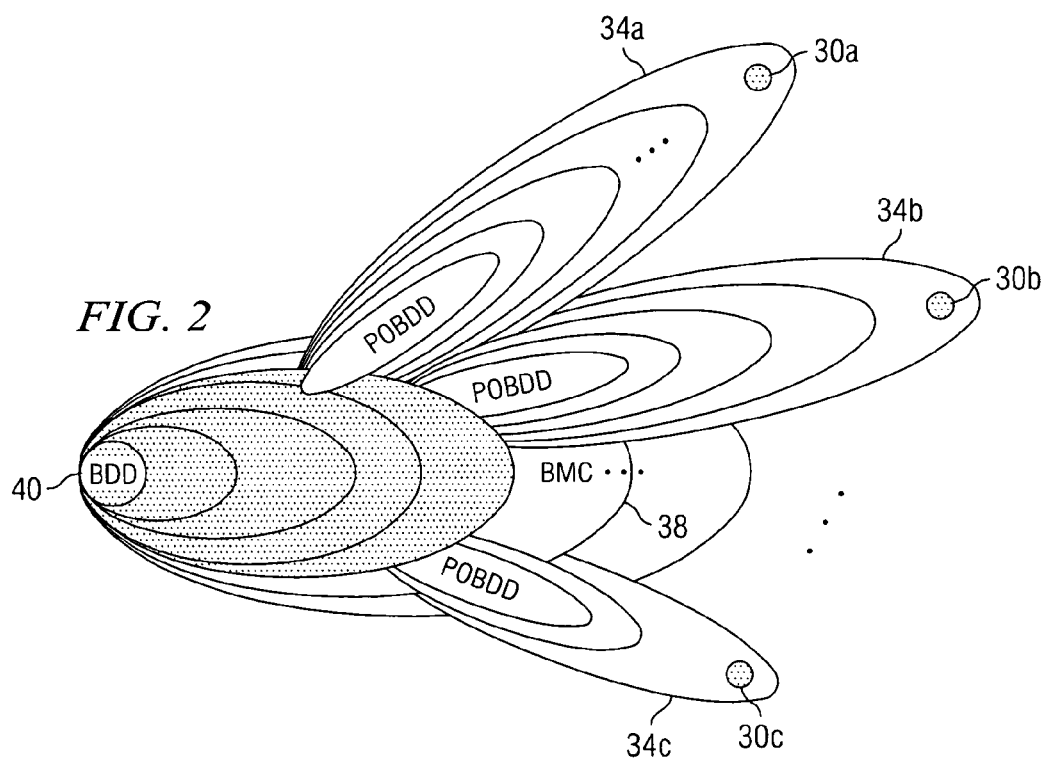
FIG. 2 illustrates example interaction of elements of the system illustrated in FIG. 1.

FIG. 2 illustrates example interaction of elements of the system illustrated in FIG. 1. FIG. 2 illustrates a set of starting points 30a–c, a set of POBDD elements 34a–c, a BMC element 38, and a BDD element 40. These elements are abstractly represented and are intended to reflect general principles associated with system 10. POBDD techniques may be employed and an analysis, which may include imaging/preimaging operations, may be executed in order to determine a first set of states that are provenly deep and that are communicated to BMC tool element 20. POBDD techniques may refer to any operation that may be executed on a data structure in order to convert it into a canonical form. Partitioned refers to the fact that the Boolean space is being broken into different sub-spaces.

For purposes of teaching, it is helpful to explain some of the imaging and preimaging operations that are executed in conjunction with POBDD techniques. Functions generally map one domain to a co-domain. Variables may be represented in terms of X and outputs may be represented in terms of Y. Each combination of X may result in some representation of Y. For each combination of X, there may be a unique combination that results and this may define the function. An image is what is produced as a result of certain operations associated with the function. An operation may be applied on the domain and what results is an image. For example, a number of states may be present and from those states many other states may be reached. From ten states, a thousand states may be reached within target circuit 12. The thousand states may be considered as reflecting an image associated with the ten states.

The image operation may be considered as a prism or a mirror that provides some reflection in order to project the corresponding image. For a given image, an object and a mirror are employed to derive the image. The object may be referred to as the starting ten states, whereby the mirror is the operation and the thousand states is the image set. In a similar fashion, preimaging operations may be defined. The preimage in the example provided may be represented by the one thousand states. The operation is still represented by the mirror and an object may be derived using these two variables. Thus, in the case of images, an object and a mirror are present and the reflection is sought. In the case of preimaging, the reflection and the mirror are present and what is being sought is the original object that projected the image.

The image operation in the case of a states-based analysis may be referred to as a transition relation operation. The transition relation operation may link the transitions that are possible in a given state space, where there are certain rules that prohibit moving from state one to state ten because links are not present. The transitions that are possible and impossible may then be captured. Thus, the mirror (transition relation operation) may indicate what transitions are possible in the system/circuit/state.

There are only some states that may be accessed after one application of a transition relation operation. Accordingly, after applying the transition relation operation, movement may be effectuated from that point to a greater depth. Similarly, from state one thousand, it may be determined the values of the original states using the transition relation operation. Accordingly, a preimage may be achieved for a given set of states. The image is the reflection of the states as provided by the mirror (transition relation operation). Imaging and/or preimaging techniques may be used in order to determine what is deep within target circuit 12.

In another example offered for purposes of teaching, it is assumed that line 1 and line 2 are states, whereby line 1 and line 2 are parallel and separated by a transition relation element. In certain scenarios, the reflection of line 2 affects information associated with line 1. However, what is generally sought is everything reflected by either line 1 or line 2 exclusively. The image and preimage operations may be used in order to determine what is being received from each of the lines. By using the process of subtraction, it may be determined what is included in line 1 and line 2. What is left may be referred to as genuine objects, contenders, or choices that maintain their integrity. From this information, it can be determined what is causing confusion or errors and eliminate these elements from the process.

In another example, consider the case where set 1 includes states 1, 2 and 3. Further consider set two, which includes states 4 and 5. All of these elements may be reflected in states 10 and 11. In analyzing states 10 and 11, a reflection is provided that is coming from states 1, 2, 3, 4, and 5. It may be recognized that it is improper to consider 4 and 5 in an analysis associated with set 1 because these elements are associated with set 2. Thus, states 4 and 5 may be subtracted from the set whereby what is left is the genuine set from set 1 (states 1, 2, and 3). The distance between sets 1 and 2 can be identified as one unit. The difference between set 2 and set 0 is two units. A calculation may then be made, at a distance of one unit, between set 1 and set 0. In a next step, the analysis may shift to set −1 and the analysis may continue to set −2 and so forth. In this sense, the information is inductively being amassed such that the analysis continues to move back in order to generate greater distances and depth. This procedure allows verification of states deeper within target circuit 12.

In an example embodiment, "deeper" generally refers to a depth parameter associated with target circuit 12, which is being analyzed. Certain states may be reachable and other states may be incapable of being reached without performing preliminary tasks first. States generally have different depths because some fixed point calculations may terminate early and some others may extend far into a given test circuit. This may be based on the characteristics of a given function. The given function may be configured such that under some window or sub-spaces, the analysis may continue for an extended depth. Additionally, provenly deep states and a heuristical set of states may be present. The provenly deep states generally require a significant amount of work in order to determine if they are deep. A heuristical set of states generally provides no guarantee as to depth. Heuristical states may be provided (potentially quickly), however, it is unknown whether these states are deep. Thus, a balance is generally achieved between these two principles. Neither speed nor depth may be neglected in executing properly verification techniques. By using POBDD data structure 14, some states may be calculated that are potentially deep or certain states may be projected as usually deep and those states may be targeted for sampling.

Referring back to FIG. 2, BMC element 38 allows a small sampling or segment of a sub-space to be explored in association with a fixed point. Once the fixed point is reached, a fixed point calculation may be executed on another sub-space. The random sampling may be executed on multiple sub-spaces, whereby the first set of states is effectively handed off by POBDD elements 34*a–c* to BMC element 38. After identifying the first set of states, it may be determined which sub-spaces have the greatest depth. For the sub-spaces that have the greatest depth, a particular set of states may be assumed to be the deepest set of states that are easily calculated. These states may be provided to BMC element 38 to take as an initial set of states in executing a deeper verification of a given circuit under test. BDD element 40 serves as the foundation or core protocol on which POBDD and BMC operations are predicated.

POBDD based BMC allows for the possibility of "Navigated Traversal" in choosing a direction to explore deeply. System 10 may further allow for a controlled form of mixing Breadth First Search (BFS) with Depth First Search (DFS) because it may allow for reaching deep states (potentially selectively).

Appropriate time intervals may also be provided in conjunction with the sampling of multiple sub-spaces within a given circuit under test. A certain amount of time may be configured in order to evaluate various sub-spaces within a target. Once the time interval has expired, the process may stop and a determination may be made. The time interval may be based on expediency issues or practicality parameters associated with a given verification process. Where no deep states are found during the designated time interval, the program may be run in a difficult mode that includes a larger time out value. Alternatively, the manner in which the selection was executed may change such that any of the already sampled sub-spaces (or types of spaces) are not revisited. By giving a guarantee or a fixed proof that a deep state will be encountered, a significant gain in efficiency may be achieved with a minimal loss. This gain in efficiency may be disproportionately high as compared to the loss.

Formal verification of a circuit may require that a reachability-based analysis be performed on the circuit to determine which states are reachable from an initial state of the circuit, which may include constructing a set of transition relations (TRs) and conjuncting every member of the set. All primary inputs and present state variables of the circuit may then be existentially quantified using the resulting formula. During the reachability-based analysis, one or more graphs may blow up, especially during conjunction. Because of problems associated with this type of blowup, BDD-based formal verification may be impractical. Formal verification may be limited in practical application to circuits that include approximately 100 or fewer latches or other circuit elements. However, many circuits include tens of thousands (or more) of circuit elements.

Figure 3:
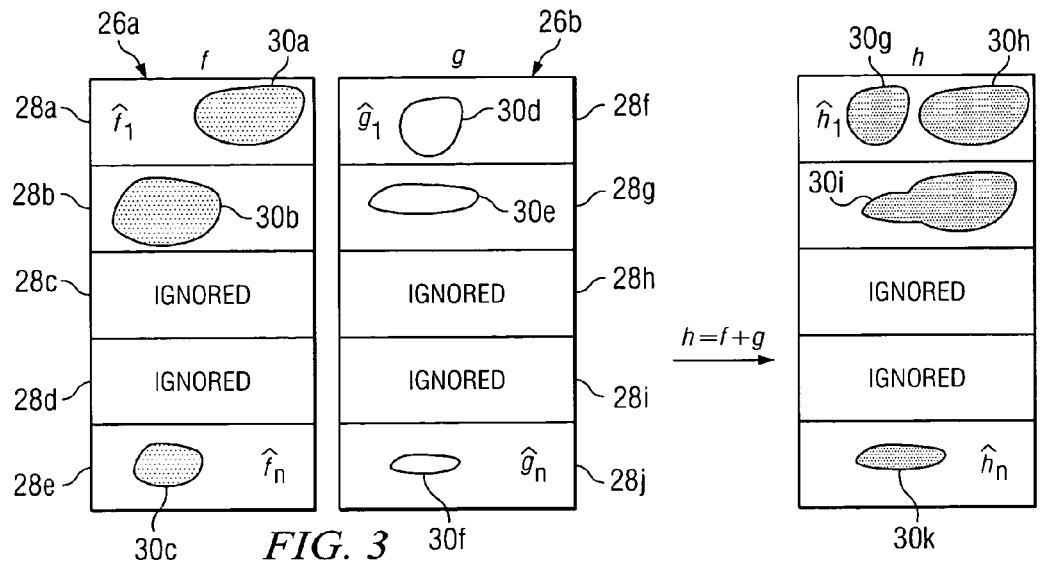
FIG. 3 illustrates example semiformal verification using one or more partitioned ordered binary decision diagrams (POBDDs)

To cover a circuit, semiformal verification may be used. FIG. 3 illustrates example semiformal verification using one or more POBDDs. Partition 26*a* includes five subspaces 28, and partition 26*b* also includes five subspaces 28. Coverage 30*a* of subspace 28*a* may be combined with coverage 30*d* of subspace 28*f* using one or more boolean operations, coverage 30*b* of subspace 28*b* may be combined with coverage 30*e* of subspace 28*g* using one or more boolean operations, and coverage 30*c* of subspace 28*e* may be combined with coverage 30*f* of subspace 28*j* using one or more boolean operations, as described above. Subspaces 28*c*, 28*d*, 28*h*, and 28*i* may be ignored according to an algorithm, as described more fully below. In particular embodiments, one or more sophisticated BDD techniques are used to provide adequate coverage of a circuit. Particular embodiments include two general strategies for semiformal verification. A first general strategy in semiformal verification is greedy searching. According to a greedy search technique, when a state space is explored, large BDDs are ignored, but at the same time coverage of a large subspace (perhaps even as large a subspace as possible) is more or less maximized. A greedy search may, but need not, be a directed search.

Ignoring large BDDs may greatly reduce state-space coverage, perhaps even to an undesirable degree. Because the size of a BDD (which may be measured by the amount of information that may be required to describe the circuit) does not necessarily indicate the number of states (or minterms) covered by the BDD, a density function of the BDD may be used to determine a contribution of the BDD to total state-space coverage. In particular embodiments, the size of a BDD is balanced against the state-space coverage of the BDD. Arbitrary reduction of a TR may prevent the TR from capturing one or more transitions in the circuit. On the other hand, if the TR is not reduced, meaningful BDD computations using the TR may be impractical. Moreover, if a large BDD is partitioned, it may be difficult to determine which of the partitions to explore.

A second general strategy in semiformal verification is design abstraction. To explore a subset of states of a circuit or perform a state-space search from an initial state of the circuit, a semiformal search may be directed to multiple windows. In particular embodiments, the windows are specified manually by a circuit designer. One or more states and input constraints applicable to the semiformal verification may be specified by the designer or determined from a simulation dump.

Multiple POBDDs may be used to cover a state space. Each POBDD corresponds to a window that is characterized by state-coverage density per BDD node and characterized by BDD size. One or more windows, in which BDD computation results in greater blowup, are marked. One or more of the marked windows may be problematic at a future point. Based on BDD history in a window, the window may be characterized as "easy" or "difficult." Greedy communication, which may facilitate coverage of multiple parts of a state space, may be used to more or less maximize state coverage. As an example, in particular embodiments, communication among multiple partitions is prioritized as follows: (1) communication from higher-density, easier partitions to lower-density, easier partitions are a first priority; (2) communication from higher-density, easier partitions to higher-density easier partitions are a second priority; and (3) communication from higher-density, easier partitions to lower-density, more difficult partitions are a third priority. One or more communications that are more or less unlikely to be helpful may be chosen last.

To handle a large TR, one or more partial assignments may be used to reduce the circuit before the TR is constructed. In particular embodiments, to handle difficult circuits (in which fewer than all partitions may be constructable), only M out of N partitions are chosen, and fix-point iteration and communication is carried out only among the chosen partitions. As an option, one or more fix-point iterations may be terminated when a new set of states being generated includes fewer states than a predefined k percent of a previously computed set of states. When a TR is reduced or a partition is generated, it may be determined whether a meaningful transition may occur from a particular partition to one or more remaining portions of the state space. A BDD may be constructed from a subset of states visited in a simulation dump. The states may then be partitioned using a POBDD splitting variable heuristics technique. One or more computed windows may then be used to generate assignments for reducing one or more large TRs.

Figure 4:
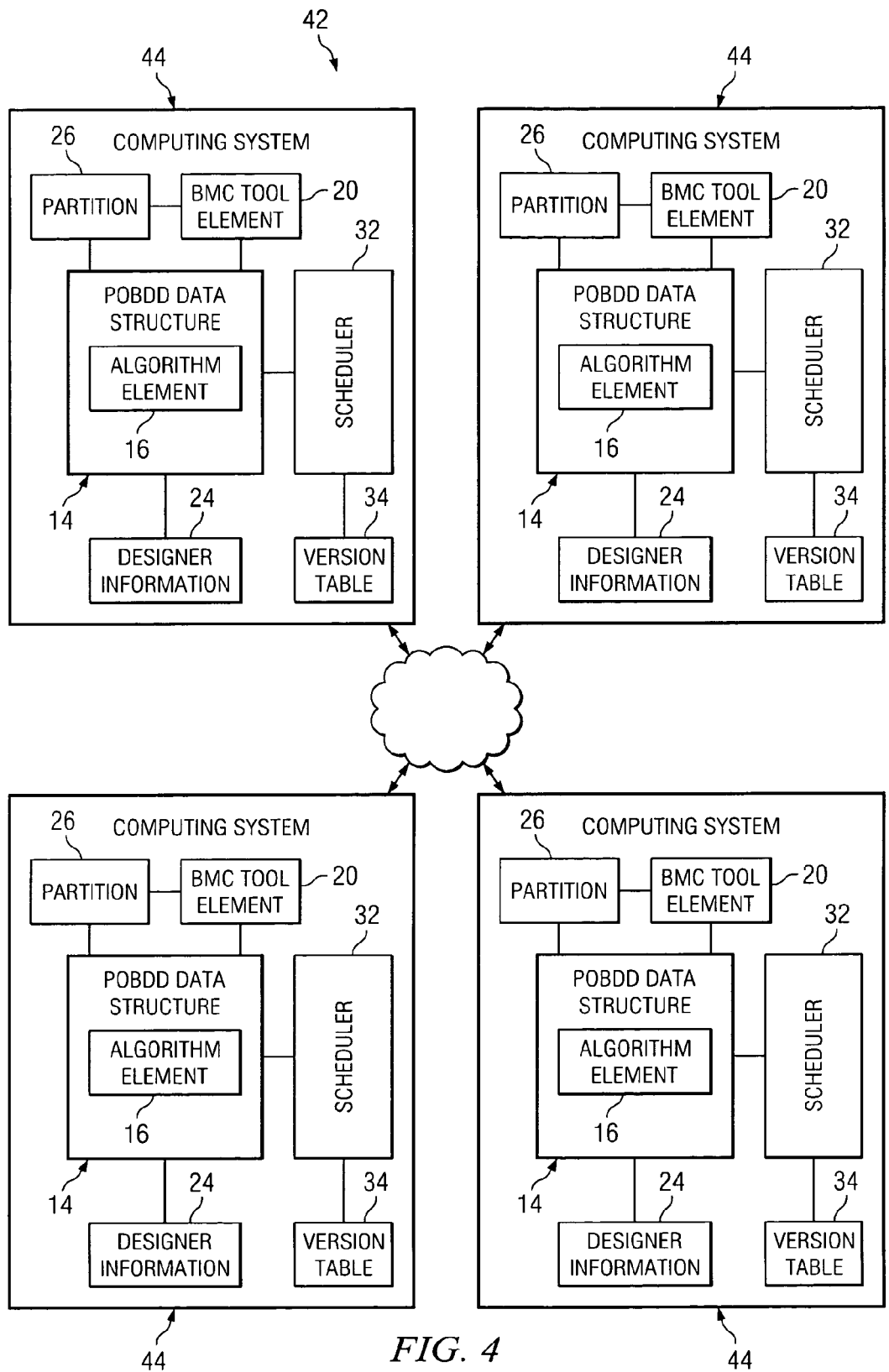
FIG. 4 illustrates an example system for determining one or more reachable states in a circuit using distributed computing and one or more partitioned data structures.

FIG. 4 illustrates an example system 42 for determining one or more reachable states in a circuit using distributed computing and one or more partitioned data structures. As described above, one or more POBDDs may be used to perform a reachability-based analysis on a circuit (such as target circuit 12) to verify one or more characteristics of the circuit. A POBDD is canonical and may be used for combinational equivalence checking. In a reachability-based analysis using one or more POBDDs, a reachable state set is represented by a POBDD. Memory requirements may be reduced by storing only one partition in a particular memory unit at a time and by saving, to a disk or other storage medium, a partition that is not currently being processed. Fix-point computations may be separately performed on each partition using a reachability algorithm and a POBDD package.

System 42 may be used to perform a reachability-based analysis on a circuit (such as target circuit 12) to identify states that are reachable from an initial state of the circuit. System 42 includes multiple computing systems 44 coupled to each other using one or more links, each of which includes one or more computer buses, local area networks (LANs), metropolitan area networks (MANs), wide area networks (WANs), portions of the Internet, or other wireline, optical, wireless, or other links. Although system 42 is illustrated as including four computing systems 44, the present invention contemplates two or more computing systems 44. In particular embodiments, two or more computing systems 44 may share one or more common components with each other. To perform a reachability-based analysis on target circuit 12, target circuit 12 is logically divided into partitions 26 (or windows) and each partition 26 is processed using a computing system 44 in a distributed processing environment, such as a cluster-based computing environment. A partition 26 of target circuit 12 is a representation of a logical, functional, or other portion of target circuit 12. In particular embodiments, partitions 26 may vary in size (which may be measured by the amount of information that may be required to describe the circuit). Computing systems 44 may process partitions 26 more or less in parallel. Each partition 26 runs until a fixed point is reached and then communicates with one or more other partitions 26.

System 42 may reduce time and memory requirements associated with a reachability-based analysis of target circuit 12. As an example and not by way of limitation, consider a computing system 44 that includes one gigabyte of random access memory (RAM) and a circuit that requires thirty-two gigabytes of RAM for a reachability-based analysis. Using a disk would be impractical due to slow disk access, and the processing system, alone, would be unable to perform the reachability-based analysis. Instead, the analysis may be distributed among thirty-two computing systems 44, that each include one gigabyte of RAM, operating more or less in parallel to reduce memory costs associated with the analysis and to achieve faster runtime.

In particular embodiments, a computing system 44 includes a POBDD data structure 14 (which includes an algorithm element 16), a BMC tool element 20, designer information 24, a partition 26, a scheduler 32 (described below), and a version table 34 (also described below). Although a particular computing system 44 is described and illustrated as including particular components in a particular configuration, the present invention contemplates any suitable computing system 44 including any suitable components in any suitable configuration. As an example and not by way of limitation, in particular embodiments, computing system 44 may include one or more components in addition or as an alternative to POBDD data structure 14, BMC tool element 20, or designer information 24 for performing additional or alternative analyses to the verification analyses described above. In particular embodiments, computing system 44 need not include POBDD data structure 14, BMC tool element 20, or designer information 24. In particular embodiments, two or more computing systems 44 in system 42 need not include components or configurations of components that are similar to each other. A processing system 44 may be integrated, fully or partially, into one or more computer systems including one or more input devices, output devices, storage media, and processors and associated memory units. Processing system 44 may, as an alternative, be coupled to one or more computer systems.

As described above, to perform a reachability-based analysis on target circuit 12, target circuit 12 is logically divided into multiple partitions 26. Each partition 26 is processed at a computing system 44 until a fixed point is reached. When a fixed point is reached, computing system 44 communicates with one or more other computing systems 44 regarding the performed analysis at computing system 44 or one or more other performed analyses at other computing systems 44.

An image or pre-image operation may need to be performed so that an initial set will be in one partition and a final set will be in another partition. This image operation may be performed by a first computing system 44, and the discovered states may be communicated to a second computing system 44. Second computing system 44 may handle the communicated states appropriately. States may be stored as a BDD, and, since each BDD may have an order for it's variables, because of this communication, the new states may be in a different variable order. The variable order of the new states may have to be reconciled between the partitions of first computing system 44 and second computing system 44 without a blow-up in the size of the resulting BDD. Trying to change variable order drastically may dramatically affect BDD size—either making the BDD much larger or much smaller. Because the set of new states is of particular interest, particular embodiments may provide substantial advantages with respect to communicating new states from one partition to another without creating large increases in memory requirements associated with the receiving partition.

An initial state may be expanded to multiple windows using a limited forward-reachability analysis to reduce idle computing-system time that could reduce gains associated with having computing systems operating in parallel. Communication among partitions 26 may be reduced by tagging the POBDDs of each partition 26 such that it can be determined when and among which computing systems 44 communication is desirable. Communications may be prioritized such that higher-density partitions 26 communicate with lower-density partitions 26 to increase coverage in one or more partitions 26. Space blowup can be reduced, or even avoided in particular embodiments, by rejecting partitions 26 that include one or more unusually large BDDs, which can, in particular embodiments, provide exponential speedup in nonerror cases as a result of sampling.

One or more procedures can be used to reduce, or even avoid in particular embodiments, communication overhead and redundant computation among partitions 26. In particular embodiments, a scheduling algorithm may be used to schedule communication among partitions 26 to reduce costs associated with communication among partitions 26.

The scheduling algorithm may facilitate greedy communication in a parallel computing environment. According to one scheduling algorithm for communication among partitions 26, each partition 26 has (1) a first vector of a version of a state reached in the partition 26 and (2) a second vector of one or more versions of one or more states reached in one or more other partitions 26. The first vector is denoted Latest, and the second vector is denoted LastCommunicated. One or more diagonal element of LastCommunicated (such as LastCommunicated[i][j]) represents a result of a preceding least fix point (LFP) computation. Scheduler 32 may be used to schedule communication between partition 26 and one or more other partitions 26. Version table 34 may indicate one or more currently needed computations, and scheduler 32 may access version table 34 to schedule communication. Version table may contain the following information regarding partition 26:

LastCommunicated[i][j]<Latest[j] indicates that Partition [i] must communicate with Partition[j].

LastCommunicated[i][j]=Latest[j] indicates that Partition [i] is up to date with Partition[j] and need not communicate with Partition[j].

LastCommunicated[i][i]<Latest[i] indicates that Partition [i] must run an LFP computation.

LastCommunicated[i][i]=Latest[i] indicates that Partition [i] has reached a fixed point.

Initially, all elements of LastCommunicated can be set to zero and all elements of Latest can be set to one.

When partition 26 has reached a new state as a result of an LFP computation or as a result of communication with one or more other partitions 26, partition 26 increases a first vector of partition 26 (Latest[i]++). If the LFP computation or the communication has been completed successfully, a second vector of partition 26 is updated (LastCommunicated [i][j]=Latest[j]). If each element of a row in version table 34 is equal to a corresponding element of Latest, no computation is required for Partition[i], and, if this condition is true for all partitions, a fixed point has been reached.

To determine a computation order, each partition 26 may be assigned a priority indicator based on BDD size and number of states covered. The priority or other suitable indicator can reflect an amount of time taken to reach a fixed point. As an example and not by way of limitation, the following algorithm, represented by pseudocode, may be used:

```
chooseTask{
    pick a small (few BDD nodes) partition (which needs to be
    computed)
    if this partition needs to communicate with a partition,
        then invoke communication task (communicate with one
        partition),
        else invoke LFP task
}
```

Due to increased resources associated with multiple computing systems 44, parallelized POBDD computations may provide significant advantages. These advantages may be particularly significant with respect to finding errors through the POBDD computations. The asymmetry between correctness and incorrectness may provide one or more of these advantages. Consider the following example. Suppose there are five partitions and each partition must perform one hundred steps. Suppose also that a bug exists at step number thirty-nine of partition five. In a sequential case, 100*4+ 39=439 steps would need to be performed to detect the bug. In contrast, in a parallel case, where there are five computing systems 44 (one for each partition), only thirty-nine steps are needed to detect the bug. If there are many more partitions, the advantages provided by the parallelization of the POBDD computations may be even more significant. This is an important aspect of parallel POBDD methods in comparison with sequential methods (including extant ROBDD, as well as POBDD, methods).

In another case, suppose a bug exists in step one hundred five of partition three. Communicating from partition i to partition j for i and j being different numbers between one and five (for a total of 5*(5−1)=20 communications) may be expensive, and such communication may be triggered after every one hundred steps. Instead, according to particular embodiments, partitions one through five may perform their first one hundred steps each, and only dense partitions communicate (according to a schedule). As a result, only eight of the twenty communications are performed, and partition three receives some of the new states. In four more steps, partition three may discover the bug (one hundred for its reachability, one for communication, and four more may be needed). Thus, computing systems 44 one through five may independently go one hundred deep and perform only eight out of twenty communication steps. Accordingly, a total time required by parallelized POBDD may be that required for approximately one hundred five operations (as just an example). In previous techniques, computation corresponding to 5*100=500 steps would have to be performed either as one hundred large steps on one or more ROBDDs or as five hundred smaller steps on one or more sequential POBDDs, followed by all twenty communications (or their equivalent ROBDD computations). This would likely kill the program, since the program would likely get bogged down in large data-structure sizes due to the difficulty of communication operations nine through twenty (followed by another set of up to one hundred images in each of the five partitions). A parallelized POBDD may provide substantial savings, because all the partitions may stop at step one hundred four as soon as partition three reports that the error has been discovered in partition three (as in the first case), and other remaining communications need not be performed.

In particular embodiments, redundant computation and sampling or trace-centric methods may be used in parallel to obtain one or more advantages. By using N computing systems 44 in parallel, one may improve the performance by a factor of N. In particular embodiments, such improvement may be greater than a factor of N (which may be referred to as non-linear gain). Consider the following example. Suppose there are eight windows. Also, suppose there are eight computing systems 44. The eight windows may be distributed among computing systems 44. In addition, in particular embodiments, another k*8 computing systems 44 (for example, 4*8=32) may be added. Accordingly, there may be four additional computing systems 44 for each window. Each window may be handled by multiple computing systems 44. Computing systems 44 may be designated m1, m2, m3, and so on. Window w1 may be handled by computing systems 44 m1, m2, m3, m4, and m5, window w2 may be handled by computing systems 44 m6, m7, m8, m9 and m10, and so on. With the additional four computing systems 44 for each window, the same POBDDs may be functionally computed for each window on computing systems 44, but each computing system 44 may process the window using different parameters. Therefore, for example, on computing system 44 m1, the BDDs may be run using a first variable-ordering method, and computing system 44 m2 may run BDDs using a second variable-ordering method. On computing system 44 m3, BDDs may be run using a first clustering size, and, on computing system 44 m2, BDDs may be run using a second clustering size.

As described above, BDDs may be sensitive to parameters. Therefore, it is possible that one of these five runs may be faster by a factor of ten or more, as compared with the default, original choice. In some cases, such as when the default, original choice was less than optimal, such gain could be a factor of one hundred or more. Accordingly, each of the five runs may continue on computing systems 44 m1–m5 until any one of computing systems 44 finishes its computations. The remaining computing systems 44 may be freed to be used for another window. Accordingly, only five computing systems 44 were used to achieve a gain factor of ten or more. In addition, computing systems 44 may be freed earlier to be used for other windows. This may provide non-linear gain.

An arbitrary number of partitions may not be possible in POBDDs. More than eight, sixteen, or thirty-two partitions may be too many partitions, since communication may be needed among the partitions and such communication is often inefficient. However, in semi-formal verification, this does not matter (which may also mean that POBDDs may be advantageous for semi-formal verification), but, in formal verification, having a large number of partitions may not cause problems. Because computing systems 44 may, in particular embodiments, be relatively inexpensive, a relatively large number of computing systems 44 may be used to process a relatively large number of windows. In that case, if there are windows w1–w8 and computing systems 44 m1–m40, without the above method, computing systems 44 m9–m40 may be unuseful. However, with the above method, those computing systems 44 will be useful and may provide non-linear gain. In particular embodiments, the processing on remaining computing systems 44 may be terminated as soon as it is clear that one of the runs is superior to the other runs. In particular embodiments, this may be a typical scenario. For most runs, it may be possible to determine which computing system 44 is providing an optimal computation. In these embodiments, all five computing systems 44 need not be used for an equal length of time. For example, if the fastest run takes one thousand seconds, slower computing systems 44 may be freed after, for example, three hundred seconds, which may provide an even higher gain factor.

Figure 5:
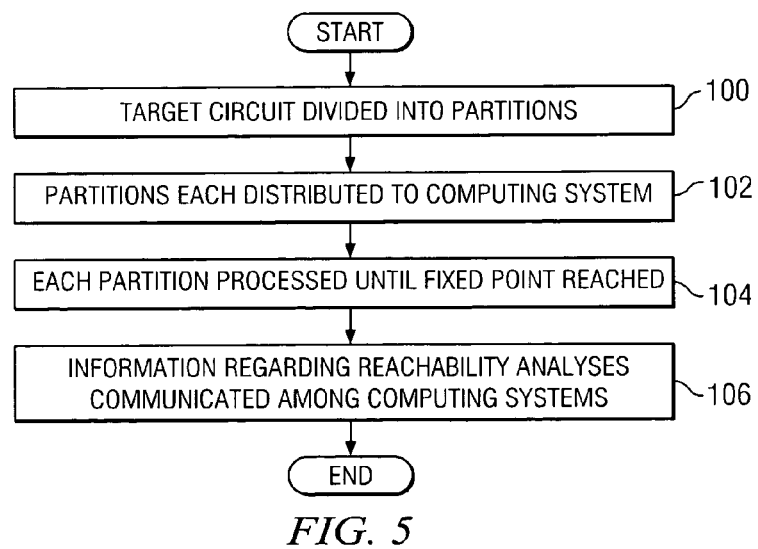
FIG. 5 illustrates an example method for determining one or more reachable states in a circuit using distributed computing and one or more partitioned data structures.

FIG. 5 illustrates an example method for determining one or more reachable states in a circuit using distributed computing and one or more partitioned data structures. The method begins at step 100, where target circuit 12 is divided into multiple partitions 26. At step 102, partitions 26 are each distributed to a computing system 44. At step 104, each partition 26 is processed until a fixed point is reached. At step 106, information regarding the reachability analyses performed at computing systems 44 is communicated among computing systems 44, at which point the method ends. As described above, further processing may be performed on partitions 26 at computing systems 44 based on the communicated information. Although particular steps of the method illustrated in FIG. 5 are described and illustrated as occurring in a particular order, the present invention contemplates any suitable steps of the method described above occurring in any suitable order.

Although the present invention has been described in detail with reference to particular embodiments, system 10 may be extended to any scenario in which verification is sought for a given target that has been designed or manufactured to perform a selected task or to include a designated property. Moreover, significant flexibility is provided by system 10 in that any suitable one or more components may be replaced with other components that facilitate their operations. For example, although system 10 has been described with reference to particular components such as BMC tool element 20, POBDD data structure 14, and algorithm element 16, these elements may be provided in a single integral unit where appropriate or replaced with devices that effectuate their functions. POBDD data structure 14 may be used with any other suitable checking or simulation protocol in order to enhance the verification capabilities thereof. Additionally, designer information 24 may be communicated or otherwise offered to POBDD data structure 14 in any appropriate manner such that BMC tool element 20 is provided with enhanced starting points for executing bounded model checking.

In addition, although system 10 has been described with reference to one or more discreet components, additional intermediate components may be provided to system 10 in order to facilitate the processing operations thereof. For example, additional components may be used in the communication of information between BMC tool element 20 and POBDD data structure 14. The present invention enjoys considerable versatility in that these components may be capable of operating in conjunction with various intermediate processing elements, in any suitable fashion, that facilitate the verification procedure for a given target element or object.

Although the present invention has been described with several embodiments, sundry changes, substitutions, variations, alterations, and modifications may be suggested to one skilled in the art, and it is intended that the invention may encompass all such changes, substitutions, variations, alterations, and modifications falling within the spirit and scope of the appended claims. The present invention is not limited, in any way, by any statement in the specification that is not reflected in the appended claims.

What is claimed is:

1. A system for determining one or more reachable states in a circuit using distributed computing and one or more partitioned data structures, the system comprising:
   a first computing system operable to:
      receive a first partition of a circuit, the first partition corresponding to a first binary decision diagram (BDD) having a first density;
      perform a first reachability analysis on the first partition using the first BDD until a fixed point in the first partition has been reached; and
      if, during the first reachability analysis, a size of the first BDD exceeds a threshold, discard the first BDD and communicate with at least one second computing system; and
   the second computing system, having received a second partition of the circuit corresponding to a second BDD having a second density and performed a second reachability analysis on the second BDD without discarding the second BDD.

2. The system of claim 1, wherein the first computing system comprises:
   a partitioned ordered binary decision diagram (POBDD) data structure operable to receive information associated with the first partition that identifies a property within the first partition to be verified and generate a first set of states at a first depth associated with a sub-space within the first partition; and a bounded model checking (BMC) tool element operable to receive the first set of states from the POBDD data structure and execute one or more bounded model checking operations using the first set of states to generate a second set of states at a second depth associated with the sub-space within the first partition, the first set of states being useable as a basis for the second set of states such that the second depth is greater than the first depth.

3. The system of claim 1, wherein the first computing system is operable to communicate according to a greedy communication algorithm.

4. The system of claim 1, wherein the first computing system is operable to communicate information regarding a computation order of the first reachability analysis.

5. The system of claim 1, wherein the first computing system comprises a scheduler operable to schedule communication between the first computing system and the second computing system, the scheduler being coupled to a version table reflecting a communication status between the first computing system and the second computing system.

6. The system of claim 5, wherein the version table comprises a first vector reflecting a state reached by the first computing system and a second vector reflecting one or more versions of one or more states reached by the second computing system.

7. A method for determining one or more reachable states in a circuit using distributed computing and one or more partitioned data structures, the method comprising, at a first computing system:
  receiving a first partition of a circuit, the first partition corresponding to a first binary decision diagram (BDD) having a first density;
  performing a first reachability analysis on the first partition using the first BDD until a fixed point in the first partition has been reached; and
  if, during the first reachability analysis, a size of the first BDD exceeds a threshold, discarding the first BDD and communicating with at least one second computing system, the second computing system having received a second partition of the circuit corresponding to a second BDD having a second density and performed a second reachability analysis on the second BDD without discarding the second BDD.

8. The method of claim 7, further comprising:
  at a partitioned ordered binary decision diagram (POBDD) data structure, receiving information associated with the first partition that identifies a property within the first partition to be verified and generating a first set of states at a first depth associated with a sub-space within the first partition; and
  at a bounded model checking (BMC) tool element, receiving the first set of states from the POBDD data structure and executing one or more bounded model checking operations using the first set of states to generate a second set of states at a second depth associated with the sub-space within the first partition, the first set of states being useable as a basis for the second set of states such that the second depth is greater than the first depth.

9. The method of claim 7, comprising communicating according to a greedy communication algorithm.

10. The method of claim 7, comprising communicating information regarding a computation order of the first reachability analysis.

11. The method of claim 7, further comprising using a scheduler to schedule communication between the first computing system and the second computing system, the scheduler being coupled to a version table reflecting a communication status between the first computing system and the second computing system.

12. The method of claim 11, wherein the version table comprises a first vector reflecting a state reached by the first computing system and a second vector reflecting one or more versions of one or more states reached by the second computing system.

13. Logic for determining one or more reachable states in a circuit using distributed computing and one or more partitioned data structures, the logic encoded in media and when executed operable, at a first computing system, to:
  receive a first partition of a circuit, the first partition corresponding to a first binary decision diagram (BDD) having a first density;
  perform a first reachability analysis on the first partition using the first BDD until a fixed point in the first partition has been reached; and
  if, during the first reachability analysis, a size of the first BDD exceeds a threshold, discard the first BDD and communicate with at least one second computing system, the second computing system having received a second partition of the circuit corresponding to a second BDD having a second density and performed a second reachability analysis on the second BDD without discarding the second BDD.

14. The logic of claim 13, comprising:
  a partitioned ordered binary decision diagram (POBDD) data structure operable to receive information associated with the first partition that identifies a property within the first partition to be verified, the POBDD data structure generating a first set of states at a first depth associated with a sub-space within the first partition; and
  a bounded model checking (BMC) tool element operable to receive the first set of states from the POBDD data structure, the BMC tool element executing one or more bounded model checking operations using the first set of states to generate a second set of states at a second depth associated with the sub-space within the first partition, the first set of states being used as a basis for the second set of states such that the second depth is greater than the first depth.

15. The logic of claim 13, operable to communicate according to a greedy communication algorithm.

16. The logic of claim 13, operable to communicate information regarding a computation order of the first reachability analysis.

17. The logic of claim 13, comprising a scheduler for scheduling communication between the first computing system and the second computing system, the scheduler being coupled to a version table reflecting a communication status between the first computing system and the second computing system.

18. The logic of claim 17, wherein the version table comprises a first vector reflecting a state reached by the first computing system and a second vector reflecting one or more versions of one or more states reached by the second computing system.

19. A system for determining one or more reachable states in a circuit using distributed computing and one or more partitioned data structures, the system comprising, at a first computing system:

means for receiving a first partition of a circuit, the first partition corresponding to a first binary decision diagram (BDD) having a first density;

means for performing a first reachability analysis on the first partition using the first BDD until a fixed point in the first partition has been reached;

means for, if, during the first reachability analysis, the size of the first BDD exceeds a threshold, discarding the first BDD; and means for communicating with at least one second computing system, the second computing system having received a second partition of the circuit corresponding to a second BDD having a second density and performed a second reachability analysis on the second BDD without discarding the second BDD.

* * * * *

UNITED STATES PATENT AND TRADEMARK OFFICE
CERTIFICATE OF CORRECTION

PATENT NO. : 7,216,312 B2
APPLICATION NO. : 10/704234
DATED : May 8, 2007
INVENTOR(S) : Jawahar Jain et al.

It is certified that error appears in the above-identified patent and that said Letters Patent is hereby corrected as shown below:

Col. 8, L. 43: After "$f_d(\Psi,X)$", delete "$(\Psi_i \leftrightarrows \psi_{ibdd})$" and insert -- $(\Psi_i \leftarrow \psi_{ibdd})$ --;

Col. 8, L. 45: Delete "$f_d(\Psi,X) \cdot (\psi_i \leftarrow \psi_{ibdd}) = \overline{\psi_{ibdd}} \cdot f_{d_{\overline{\psi_i}}} + \psi_{ibdd} \cdot f_{d_{\psi_i}} n$" and insert -- $f_d(\Psi,X) \cdot (\psi_i \leftarrow \psi_{ibdd}) = \overline{\psi_{ibdd}} \cdot f_{d_{\overline{\psi_i}}} + \psi_{ibdd} \cdot f_{d_{\psi_i}}$ --;

Col. 9, L. 55: delete "$r_x(f) = \left(\frac{|f_x + f_x|}{|f|}\right)$" and insert -- $r_x(f) = \left(\frac{|f_x + f_{\bar{x}}|}{|f|}\right)$ --.

Signed and Sealed this

Sixth Day of October, 2009

David J. Kappos
*Director of the United States Patent and Trademark Office*